US012218149B2

(12) United States Patent
Wang et al.

(10) Patent No.: US 12,218,149 B2
(45) Date of Patent: Feb. 4, 2025

(54) DUAL GATE ARRAY SUBSTRATE AND DISPLAY PANEL

(71) Applicants: Beijing BOE Display Technology Co., Ltd., Beijing (CN); BOE Technology Group Co., Ltd., Beijing (CN)

(72) Inventors: Cong Wang, Beijing (CN); Yingmeng Miao, Beijing (CN); Dongchuan Chen, Beijing (CN); Seungmin Lee, Beijing (CN); Yanping Liao, Beijing (CN); Xibin Shao, Beijing (CN); Jiantao Liu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/637,893

(22) PCT Filed: Apr. 27, 2021

(86) PCT No.: PCT/CN2021/090182
§ 371 (c)(1),
(2) Date: Feb. 24, 2022

(87) PCT Pub. No.: WO2022/226768
PCT Pub. Date: Nov. 3, 2022

(65) Prior Publication Data
US 2024/0096902 A1 Mar. 21, 2024

(51) Int. Cl.
*G02F 1/1362* (2006.01)
*G02F 1/1333* (2006.01)
(Continued)

(52) U.S. Cl.
CPC ........ *H01L 27/124* (2013.01); *G02F 1/13394* (2013.01); *G02F 1/136286* (2013.01);
(Continued)

(58) Field of Classification Search
CPC .. G02F 1/133; G02F 1/1333; G02F 1/133345; G02F 1/1343; G02F 1/134309; G02F 1/134318; G02F 1/134363; G02F 1/1362; G02F 1/136227; G02F 1/136286; G02F 1/1368; G02F 1/13394
See application file for complete search history.

(56) References Cited

U.S. PATENT DOCUMENTS

2017/0148818 A1* 5/2017 Jia ..................... H01L 27/124

FOREIGN PATENT DOCUMENTS

| CN | 104570530 A | 4/2015 |
| CN | 104916650 A | 9/2015 |

(Continued)

*Primary Examiner* — Thoi V Duong
(74) *Attorney, Agent, or Firm* — Nath, Goldberg & Meyer; Joshua B. Goldberg

(57) ABSTRACT

A dual gate array substrate includes a plurality of groups of dual gate lines, a plurality of data lines, a plurality of pixel pairs and a plurality of common electrode lines, each common electrode line is arranged between two pixel units in a same pixel pair; and a layer where the common electrode line is located and a layer where a source/drain electrode of a thin film transistor is located are different layers and insulated from each other.

18 Claims, 10 Drawing Sheets

(51) Int. Cl.
*G02F 1/1339* (2006.01)
*G02F 1/1343* (2006.01)
*G02F 1/1368* (2006.01)
*H01L 27/12* (2006.01)

(52) U.S. Cl.
CPC ...... *G02F 1/1368* (2013.01); *G02F 1/133345* (2013.01); *G02F 1/134363* (2013.01); *G02F 1/136227* (2013.01)

(56) References Cited

FOREIGN PATENT DOCUMENTS

| | | |
|---|---|---|
| CN | 105159001 A | 12/2015 |
| CN | 110456585 A | 11/2019 |
| CN | 111338144 A | 6/2020 |
| KR | 10-2013-0065246 A | 6/2013 |
| KR | 10-2018-0078924 A | 7/2018 |

* cited by examiner

DUAL GATE ARRAY SUBSTRATE AND DISPLAY PANEL

This is a National Phase Application filed under 35 U.S.C. 371 as a national stage of PCT/CN2021/090182, filed Apr. 27, 2021, the content of which is hereby incorporated by reference in its entirety.

TECHNICAL FIELD

The present disclosure belongs to the field of display technology, and particularly relates to a dual gate array substrate and a display panel.

BACKGROUND

In displays such as LCD and LED displays, an array substrate is one of the main components. In the array substrate, pixel units are periodically arranged. Each pixel unit may include a Thin Film Transistor (TFT) and a pixel electrode, and each pixel electrode is driven by connecting a data line and a gate line to the TFT. In general, the data line is connected to a source electrode of the thin film transistor, the gate line is connected to a gate electrode of the thin film transistor, and the pixel electrode is connected to a drain electrode of the thin film transistor.

In a single gate array substrate, assuming that the array substrate includes N*M pixel units, the single gate array substrate may include N gate lines and M data lines; the pixel units are disposed at intersections of the gate lines and the data lines; and different combinations of the gate lines and the data lines may drive different pixel units.

In order to reduce the cost of the product, a dual gate array substrate is provided in the prior art. Compared with the above-mentioned single gate array substrate, the number of data lines may be substantially reduced by half in the dual gate array substrate, and the cost of a driving circuit (IC) connected with the data lines is reduced correspondingly, so that the cost of the product can be reduced. Meanwhile, since the number of gate lines is substantially doubled, the aperture ratio of the pixel may be affected adversely to some extent, which cannot meet the requirement of the high resolution display panel.

SUMMARY

The present disclosure at least partially solves the problem that the aperture ratio of the pixel unit in the existing dual gate array substrate is limited, and thus, provides a dual gate array substrate with higher aperture ratio.

The technical solution adopted for solving the technical problem of the present disclosure is a dual gate array substrate, including a plurality of groups of dual gate lines, a plurality of data lines and a plurality of pixel pairs arranged on a first substrate; each group of the plurality of groups of dual gate lines including two gate lines opposite to each other; the plurality of groups of dual gate lines intersecting with the plurality of data lines; each group of dual gate lines and the plurality of data lines defining a plurality of defined regions; each pixel pair being in a corresponding defined region; the pixel pair including two pixel units arranged along an extending direction of the gate line; the pixel unit including a common electrode and a thin film transistor,
  wherein the dual gate array substrate further includes a plurality of common electrode lines, each of the plurality of common electrode lines is arranged between two pixel units in a same pixel pair and is connected to the common electrodes of the two pixel units through two first vias respectively;
  a layer where the common electrode line is located and a layer where a source/drain electrode of the thin film transistor is located are different layers and insulated from each other; and
  the two first vias are on both sides of the data line.

In some examples, the common electrode line and a gate electrode of the thin film transistor are in a same layer and insulated from each other.

In some examples, the two pixel units in the same pixel pair are connected to a same data line; in two pixel pairs adjacent to each other in an extending direction of the data line, the pixel units in different pixel pairs are connected to two adjacent data lines, respectively; and in two pixel pairs adjacent to each other in the extending direction of the gate line, the pixel units in different pixel pairs are connected to two adjacent data lines, respectively.

In some examples, the pixel unit further includes a pixel electrode; an insulating layer is arranged between a layer where the pixel electrode is located and the layer where the source/drain electrode of the thin film transistor is located; the insulating layer includes a first via, through which the pixel electrode is connected to a drain electrode of a corresponding thin film transistor; and in the same pixel pair, a region of the first via in the extending direction of the gate line falls into a region of a corresponding pixel unit in the extending direction of the gate line.

In some examples, an orthographic projection of the common electrode on the first substrate covers an orthographic projection of the pixel electrode on the first substrate.

In some examples, the common electrodes of both pixel units in the same pixel pair have a one-piece structure.

In some examples, a layer, where the pixel electrode is located, is on a side of a layer, where the thin film transistor is located, close to the first substrate; and a layer, where the common electrode is located, is on a side of the layer, where the thin film transistor is located, away from the first substrate.

In some examples, a size of the pixel electrode is greater than or equal to 170 μm*170 μm.

In some examples, a layer, where the pixel electrode is located, is on a side of a layer, where an active layer of the thin film transistor is located, away from the first substrate; and a layer, where the common electrode is located, is on a side of the layer, where the source/drain electrode of the thin film transistor is located, away from the first substrate.

In some examples, a size of the pixel electrode is smaller than 170 μm*170 μm.

In a second aspect, an embodiment of the present disclosure further provides a display panel, including any one of the above dual gate array substrates.

In some examples, the display panel further includes a color filter substrate; the color filter substrate and the array substrate are aligned and assembled to form a cell; the color filter substrate includes spacers which are arranged on a second substrate, and an orthographic projection of the spacers on the first substrate is overlapped with an orthographic projection of certain data lines of the plurality of data lines on the first substrate, and is not overlapped with an orthographic projection of the gate lines on the first substrate.

In some examples, four of the plurality of pixel pairs, which are adjacent to each other in a direction of the data line and adjacent to each other in a direction of the gate line, form one pixel group; a center of a region where the spacer is located overlaps with a center of a region where the one pixel group is located.

In some examples, the color filter substrate further includes a black matrix layer which is arranged on a side of a layer, where the spacers are located, close to the second substrate; and an orthographic projection of the black matrix layer on the first substrate covers an orthographic projection of the spacers on the first substrate.

BRIEF DESCRIPTION OF DRAWINGS

The accompanying drawings, which are included to provide a further understanding of the present disclosure and constitute a part of this specification, serve to explain the present disclosure together with the following specific embodiments, but do not constitute a limitation to the present disclosure. In the drawings.

DETAIL DESCRIPTION OF EMBODIMENTS

Figure 1:
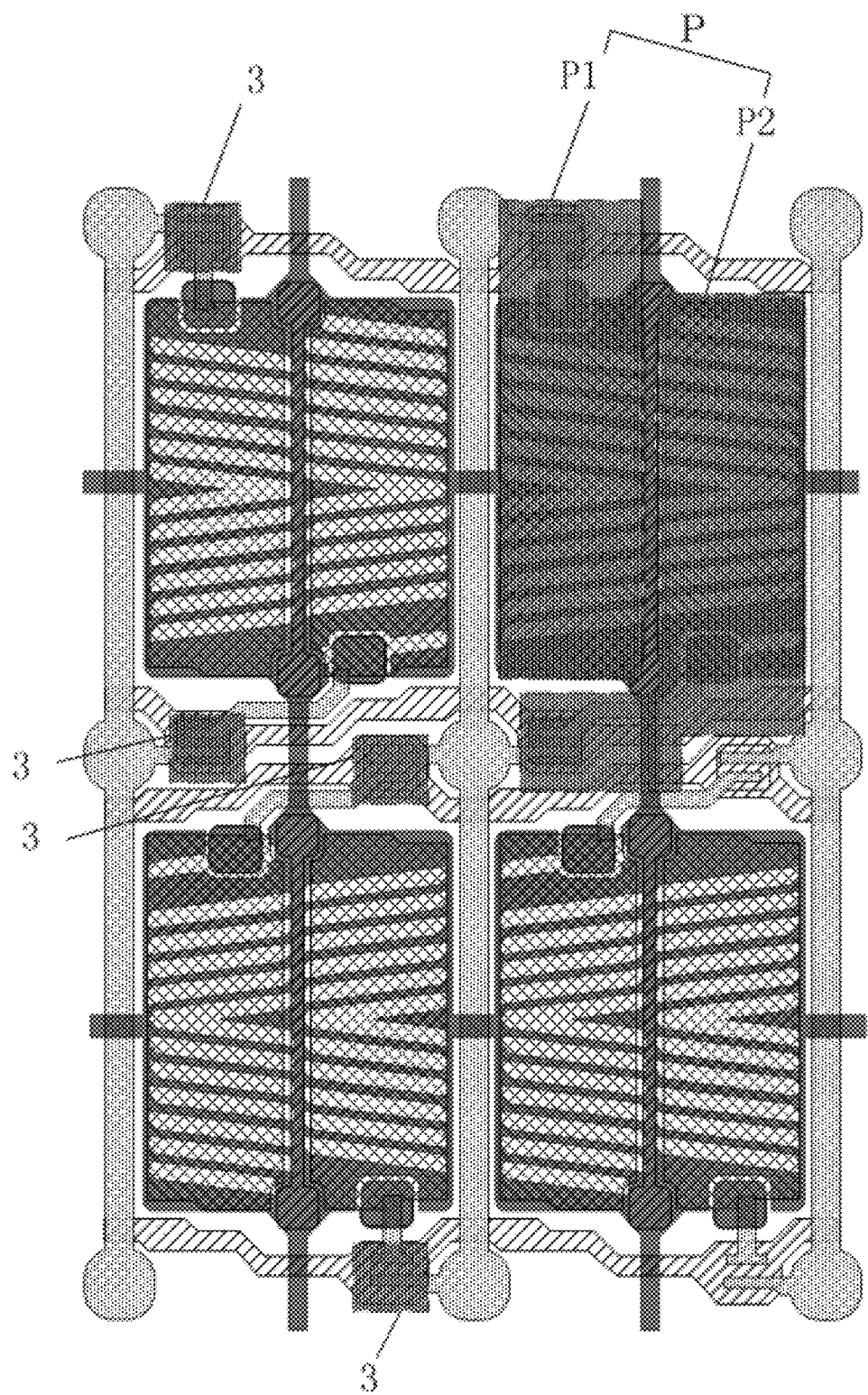
FIG. 1 is a schematic plan view of a dual gate array substrate according to an embodiment of the present disclosure.

In order to make the objects, technical solutions and advantages of the present disclosure more apparent, the present disclosure will be described in further detail with reference to the accompanying drawings. Obviously, the described embodiments are only some of the embodiments of the present disclosure, not all of the embodiments. All other embodiments, which may be obtained by one of ordinary skill in the art without any creative effort based on the embodiments in the present disclosure, fall within the protection scope of the present disclosure.

The shapes and sizes of the components in the drawings are not to scale, but are merely intended to facilitate an understanding of the contents of the embodiments of the present disclosure.

Unless defined otherwise, technical or scientific terms used herein shall have the ordinary meaning as understood by one of ordinary skill in the art to which the present disclosure belongs. The words "first", "second", and the like used in the present disclosure do not denote any order, quantity, or importance, but rather distinguish one element from another. Likewise, the words "a", "an", or "the" and the like do not denote a limitation of quantity, but rather denote the presence of at least one. The words "comprising (including)" or "comprises (includes)", and the like, mean that the element or item preceding the word includes the element or item listed after the word and its equivalent, but do not exclude other elements or items. The terms "connected" or "coupled" and the like are not restricted to physical or mechanical connections, but may include electrical connections, whether direct or indirect. "Upper", "lower", "left", "right", and the like are used only to indicate relative positional relationships, and when the absolute position of the object being described is changed, the relative positional relationships may also be changed accordingly.

The disclosed embodiments are not limited to the embodiments shown in the drawings, but include modifications of configurations formed based on a manufacturing process. Thus, regions illustrated in the figures have schematic properties, and the shapes of the regions shown in the figures illustrate specific shapes of regions of elements, but are not intended to be limiting.

Referring to FIGS. 1 to 12, a dual gate array substrate includes a first substrate 11 and a plurality of groups of dual gate lines 14 oppositely arranged, a plurality of data lines 15 and a plurality of pixel pairs P, which are disposed on the first substrate 11. The plurality of groups of dual gate lines 14 intersect with the plurality of data lines 15; each group of the plurality of groups of dual gate lines 14 includes two gate lines 14 opposite to each other; each group of dual gate lines 14 and the plurality of data lines 15 define a plurality of defined regions arranged along an extending direction of the gate line 14. That is, the plurality of groups of dual gate lines 14 and the plurality of data lines 15 define a defined region array composed of the plurality of defined regions, wherein a row direction of the defined region array may be the extending direction of the gate line 14, and a column direction of the defined region array is an extending direction of the data line 15.

Figure 5:
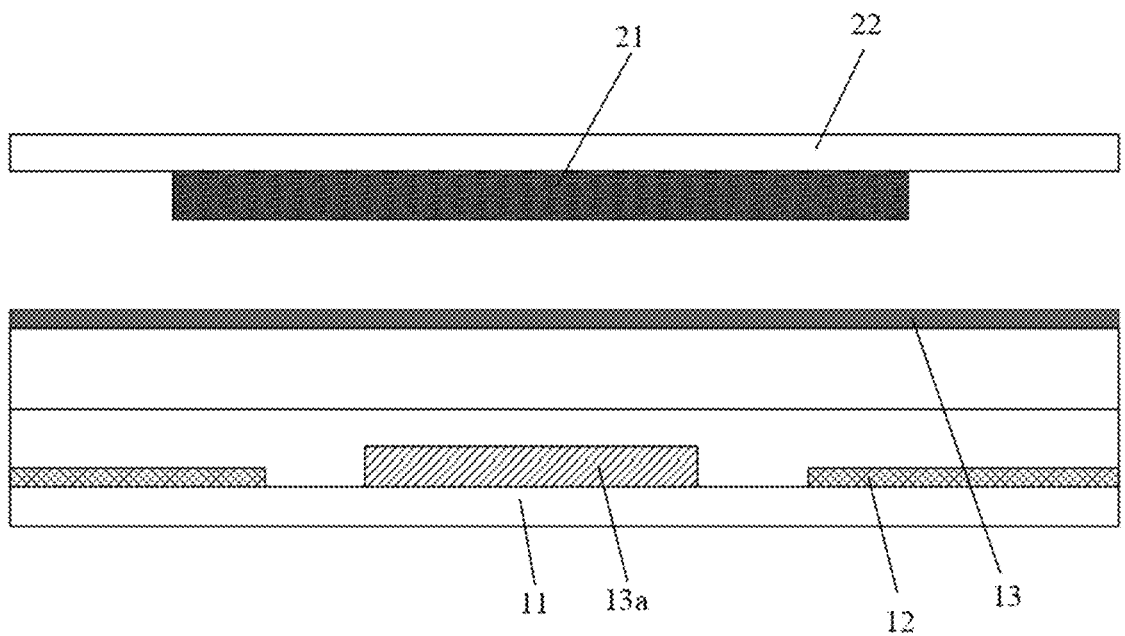
FIG. 5 is a schematic cross-sectional view along a line BB' in the plan view of the dual gate array substrate shown in FIG. 3.

A pixel pair P is located in the respective defined region, and includes two pixel units P1 and P2 arranged along the extending direction of the gate line 14. Each pixel unit includes a pixel electrode 12, a common electrode 13, and a thin film transistor 3. Each pixel unit is connected to a gate line 14 and a data line 15. Specifically, the gate line 14 is connected to a gate electrode 33 of the thin film transistor 3, the data line 15 is connected to a first electrode of the thin film transistor 3, and a second electrode of the thin film transistor 3 is connected to the pixel electrode 12. In the dual gate array substrate, two pixel units P1 and P2 in the same pixel pair P are connected to a same data line 15. Meanwhile, the duel gate array substrate further includes a plurality of common electrode lines 13a, each of which is arranged between two pixel units P1 and P2 in a same pixel pair P and is connected in parallel with the common electrodes 13, so as to reduce the resistance of the common electrodes 13 in the dual gate array substrate. Referring to FIGS. 1 and 5, the plurality of common electrode lines 13a include vertical common electrode lines 13a extending in the extending direction of the data line 15. In the related art, the common electrode line 13a is generally provided in a same layer as a source/drain electrode 31 of the thin film transistor 3. When one pixel unit (second pixel unit) of the pixel pair P, which is farther from the data line 15, is connected to the data line 15, in order to prevent the common electrode line 13a from being short-circuited with the drain electrode of the thin film transistor 3, a via is provided in an region where the pixel unit (first pixel unit) closer to the data line 15 is located, and the data line 15 is connected to the pixel electrode 12 of the second pixel unit through the via.

That is, in the prior art, the thin film transistor 3 of the second pixel unit needs to be connected to the pixel electrode 12 of the second pixel unit through the via located in the region where the first pixel unit is located. The thin film transistor 3 of the first pixel unit also needs to be connected to the pixel electrode 12 of the first pixel unit through a via located in the region where the first pixel unit is located. Therefore, there should be at least two vias in the region where the first pixel unit is located, and the vias occupy an area of an aperture region of the pixel unit, resulting in a limited aperture ratio of a pixel of the array substrate, which affects the display effect of the display panel.

The present disclosure provides a dual gate array substrate and a display panel, which aims at the problem of a limited aperture ratio of a pixel of the array substrate. In the dual gate array substrate, the common electrode line 13a and a pattern of the source/drain electrode 31 of the thin film transistor 3 are provided in different layers and insulated from each other. In this way, when the thin film transistor 3 corresponding to the second pixel unit is connected to the pixel electrode 12, the drain electrode of the thin film transistor 3 may extend across a gap region between the first pixel unit and the second pixel unit, and is directly connected to the pixel electrode 12 of the pixel unit. Since the common electrode line 13a and the pattern of the source/drain electrode 31 are provided in different layers and insulated from each other, the common electrode line 13a is not connected to the source/drain electrode 31 of the thin film transistor 3. Meanwhile, since the drain electrode of the thin film transistor 3 extends across the gap region to the region where the second pixel unit is located, the connection between the drain electrode and the pixel electrode 12 may be realized by directly providing the via in the region where the second pixel unit is located, without providing the via in the region where the first pixel unit is located. In this way, the number of the vias can be reduced in the region where the first pixel unit is located, thereby reducing the occupation of the aperture ratio of the pixel region and improving the aperture ratio of the dual gate array substrate.

It can be understood that, in the array substrate, areas of aperture regions of pixel units, especially the pixel units of a same color, should be the same. Compared with the prior art, in the present disclosure, by adjusting the position of a structure of the layer where the common electrode line 13a is located, that is, providing a via which is originally required to be provided in the region where the first pixel unit is located to the region where the second pixel unit is located, the aperture ratio of the first pixel unit is improved, thereby solving the problem that the whole aperture ratio of the array substrate is low due to the low aperture ratio of the first pixel unit in the prior art. Meanwhile, in some embodiments, the patterns of the common electrodes 13 are connected to each other in the extending direction of the gate line, thereby ensuring the uniformity of the common voltage for the entire dual gate array substrate.

Referring to FIGS. 1 to 12, in some embodiments provided by the present disclosure, the dual gate array substrate includes the plurality of groups of dual gate lines 14 oppositely arranged, the plurality of data lines 15, and the plurality of pixel pairs P, which are disposed on the first substrate 11. Each pixel pair P is located in a corresponding region defined by intersecting the plurality of groups of dual gate lines 14 with the plurality of data lines 15; and includes two pixel units arranged along the extending direction of the gate line 14; each pixel unit includes the common electrode 13 and the thin film transistor 3. The dual gate array substrate further includes at least one common electrode line 13a provided between two pixel units in a same pixel pair P and connected to two common electrodes 13 of two pixel units.

Figure 2:
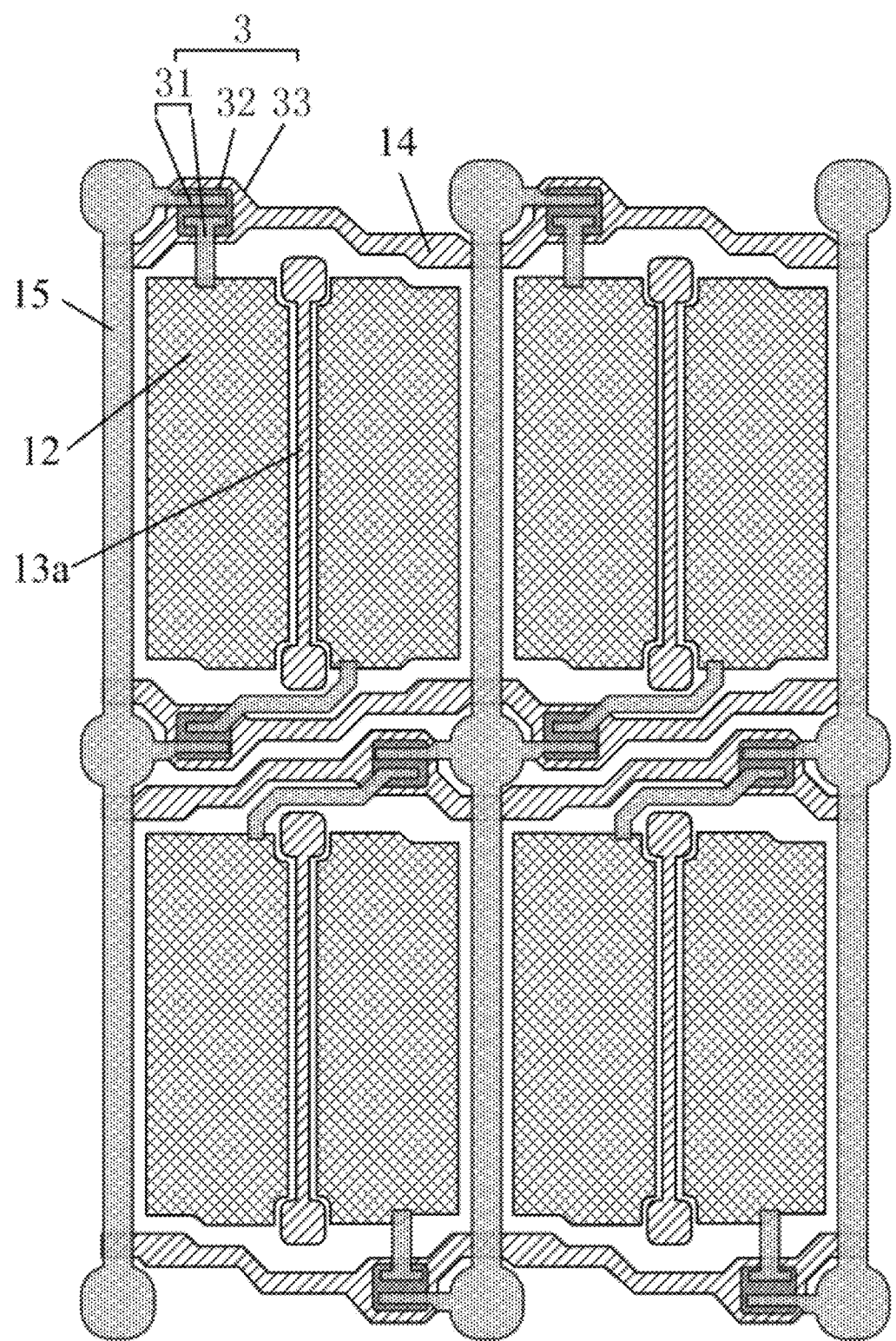
FIG. 2 is a schematic plan view of the dual gate array substrate in FIG. 1 with a common electrode removed.
Figure 3:
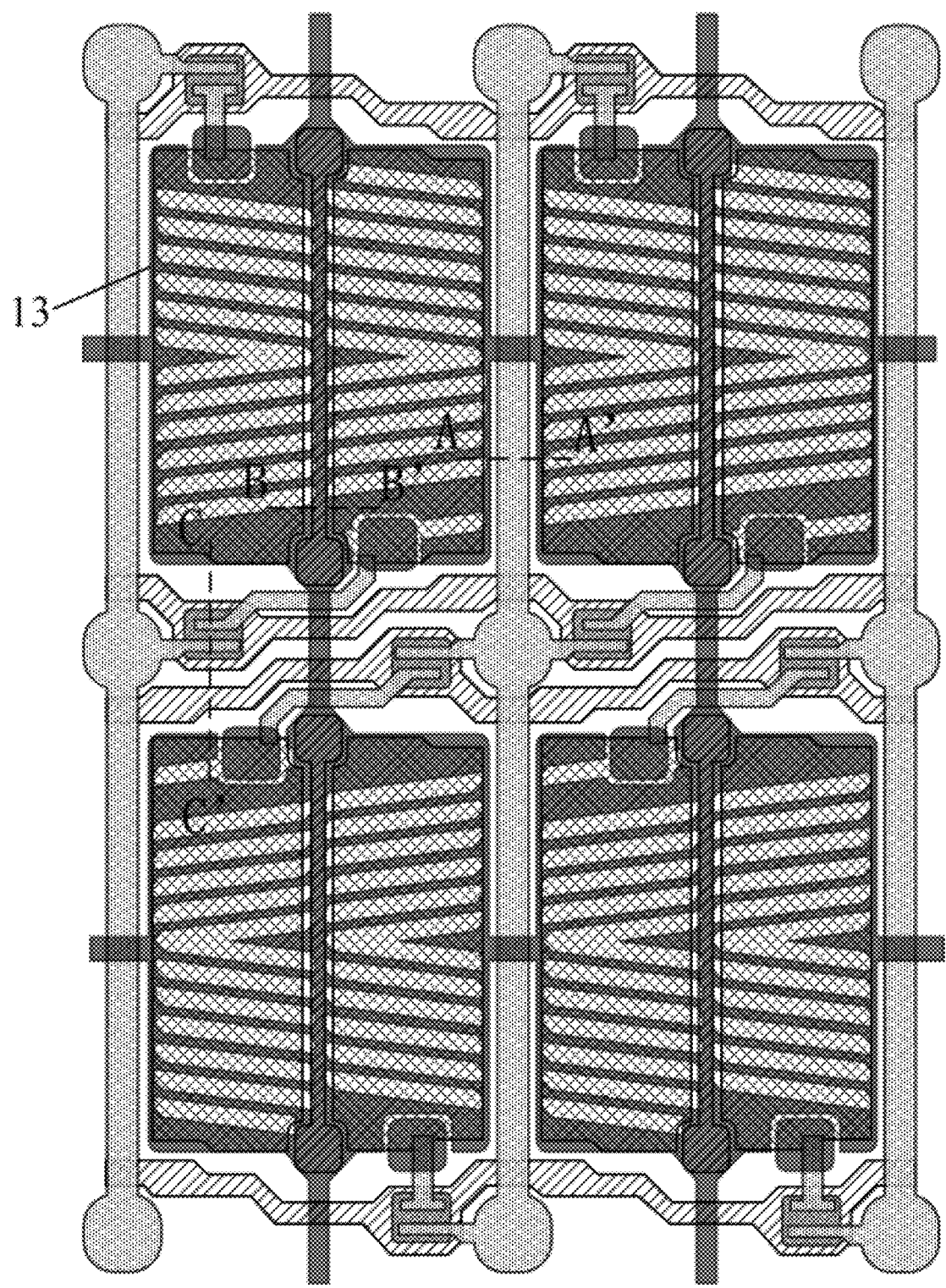
FIG. 3 is a schematic plan view of a dual gate array substrate according to an embodiment of the present disclosure.

In some embodiments, the common electrode line 13a and the gate electrode 33 of the thin film transistor 3 are provided in a same layer and insulated from each other. As shown in FIG. 2, the thin film transistor 3 may include the gate electrode 33, a gate insulating layer, an active layer 32, the source/drain electrode 31, and the like, which are sequentially disposed on the substrate. The thin film transistor 3 may be a top gate type TFT or a bottom gate type TFT according to the order of its hierarchical structures. Taking the bottom gate type TFT as an example, the basic structure of the bottom gate type TFT includes the substrate, and the gate electrode 33, the gate insulating layer, the active layer 32, the source/drain (S/D) electrode, and an insulating protective layer, which are sequentially stacked on the substrate. In the present disclosure, the common electrode line 13a and the source/drain electrode 31 are provided in different layers and insulated from each other, and the common electrode line 13a may be directly provided in a same layer as the gate electrode 33 which is provided in different layers with the source/drain electrode 31 and insulated from the source/drain electrode 31, thereby simplifying the manufacturing process of the array substrate. In some embodiments, the gate electrode 33 of the thin film transistor 3 and the gate line 14 may be provided in a same layer and formed through one patterning process. That is, in the embodiment of the present disclosure, the common electrode line 13a, the gate electrode 33, and the gate line 14 may be formed through one patterning process, and the specific material may include metal oxides such as ITO and IZO, or metals such as Ag, Al, and Mo, or alloys thereof.

In some embodiments, two pixel units in the same pixel pair P are connected to a same data line 15; in two pixel pairs P adjacent to each other in the extending direction of the data line 15, the pixel units in different pixel pairs P are respectively connected to two adjacent data lines 15; in two pixel pairs P adjacent to each other in the extending direction of the gate line 14, the pixel units in different pixel pairs P are respectively connected to two adjacent data lines 15. Referring to FIG. 1, each pixel unit includes the thin film transistor 3 and the pixel electrode 12 connected to the thin film transistor 3; the pixel units in the dual gate array substrate are arranged in a matrix; in a column direction, two gate lines 14 on both sides of the pixel unit are defined as a group of dual gate lines 14, and each group of dual gate lines 14 includes two gate lines 14 for transmitting a first scanning signal and a second scanning signal; one data line 15 is arranged every two pixel units (one pixel pair P) in the pixel units of a same row in the dual gate array substrate, and the two pixel units in each pixel pair P are connected to a same data line 15. In some embodiments, the pixel unit further includes the pixel electrode 12; the insulating layer is arranged between the layer where the pixel electrode 12 is located and the layer where the source/drain electrode 31 of the thin film transistor 3 is located; the insulating layer includes a first via through which the pixel electrode 12 is connected to the drain electrode of the corresponding thin film transistor 3; in the same pixel pair P, a region of the first via in the extending direction of the gate line 14 falls into a region of the corresponding pixel unit in the extending direction of the gate line 14. In the embodiment of the present disclosure, by arranging the first via in the region of the corresponding pixel unit in the extending direction of the gate line 14 on the substrate, the aperture ratio of the pixel unit is improved.

In some embodiments, the pixel electrodes 12 of each pixel unit have the same size and shape. In some embodiments of the prior art, the thin film transistor 3 may be one of: an inorganic thin film transistor 3, or an organic thin film transistor 3. The inorganic thin film transistor 3 may include an amorphous silicon thin film transistor 3, a polycrystalline silicon thin film transistor 3, and the like. In other embodiments, the thin film transistor 3 may be any thin film transistor 3 that may be suitable or developed in the future. In addition, the thin film transistor 3 may be transparent.

Figure 4:
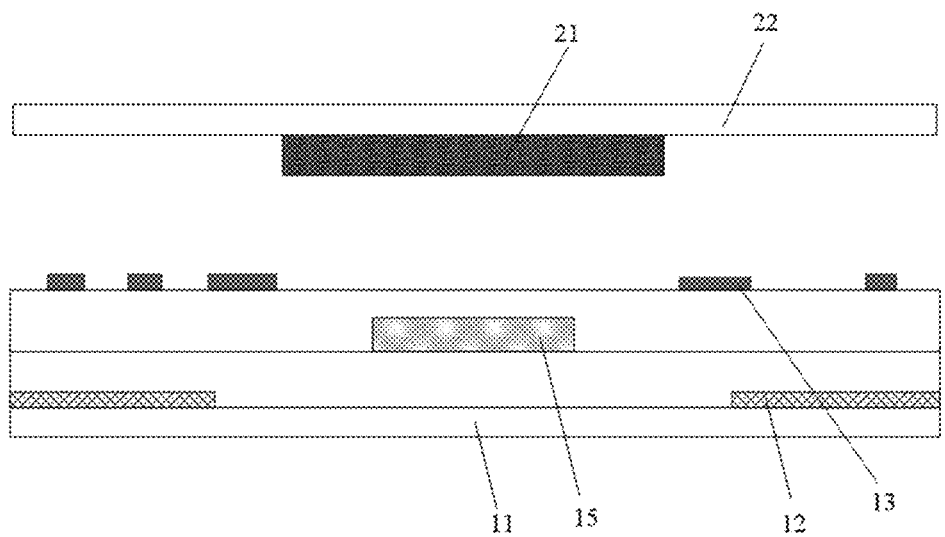
FIG. 4 is a schematic cross-sectional view along a line AA' in the plan view of the dual gate array substrate shown in FIG. 3.
Figure 6:
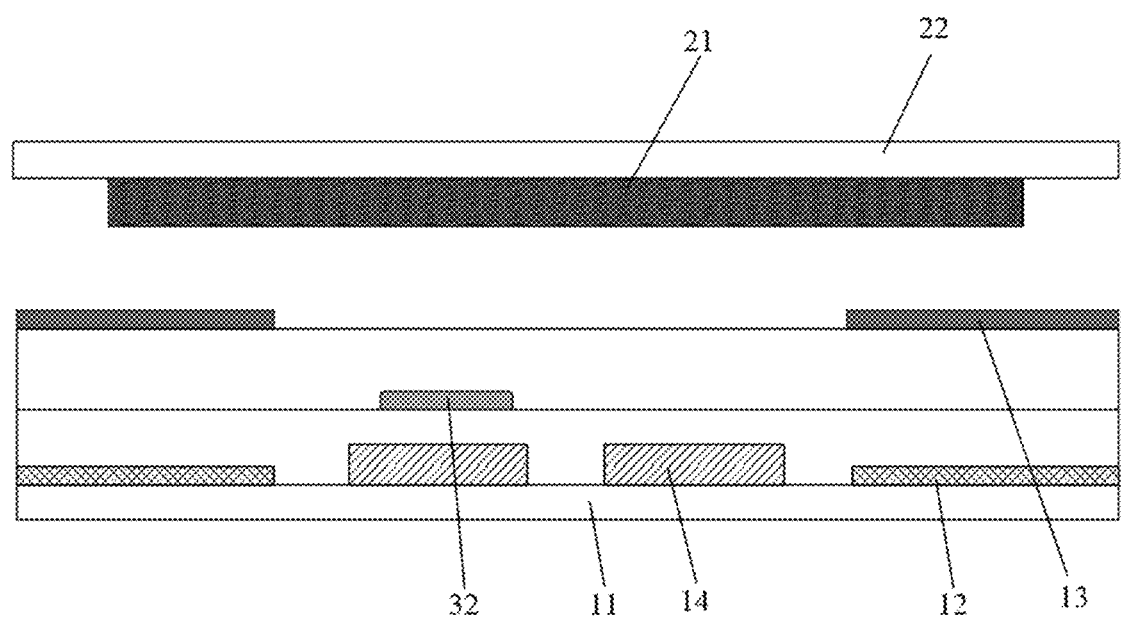
FIG. 6 is a schematic cross-sectional view along a line CC' in the plan view of the dual gate array substrate shown in FIG. 3.

In some embodiments, an orthogonal projection of the common electrode 13 on the first substrate 11 covers an orthogonal projection of the pixel electrode 12 on the first substrate 11. Referring to FIGS. 4 to 6, an edge of the orthographic projection of the common electrode 13 on the first substrate 11 falls between an edge of the orthographic projection of the pixel electrode 12 on the first substrate 11 and an edge of an orthographic projection of other conductive structures on the first substrate 11, that is, the orthographic projection of the common electrode 13 on the first substrate 11 covers, with a margin, the orthographic projection of the pixel electrode 12 on the first substrate 11, so that the common electrode 13 may be used to shield an electric field between the pixel electrode 12 and other conductive structures (the gate electrode 33 and the data line 15) in the array substrate, and the pulling effect of the other conductive structures on the pixel electrode 12 is reduced. In some embodiments, the common electrodes 13 of the two pixel units in a same pixel pair P have a one-piece structure. The common electrodes 13 of the two pixel units have a one-piece structure, to reduce the resistance of the common electrode 13, reduce the voltage drop of the common electrode 13 in the array substrate, and ensure the uniformity of common voltage at each position of the array substrate.

In some embodiments, a layer, where the pixel electrode 12 is located, is on a side of a layer, where the thin film transistor 3 is located, close to the first substrate 11; a layer, where the common electrode 13 is located, is on a side of the layer, where the thin-film transistors 3 is located, away from the first substrate 11. The pixel electrode 12 and the common electrode 13 are disposed oppositely to each other in a thickness direction of the first substrate 11, and the pixel electrode 12 and the common electrode 13 cooperate to form a control electric field, to control the rotation of the liquid crystals. In some embodiments, a size of the pixel electrode 12 is greater than or equal to 170 µm*170 µm.

The dual gate array substrate according to the embodiment of the present disclosure may be used for an 8k liquid crystal display panel. In the conventional 8k liquid crystal display panel, the pixel resolution of the display panel is required to be high, and the pixel size is small, for example, the pixel size of a 65 inch 8k display panel is 186 µm*186 µm; the pixel size of a 75 inch 8k display panel is 214.8 µm*214.8 µm. The display panel provided by the embodiment is beneficial to improving the aperture ratio of the display panel and improving the display effect of the 8k display panel.

In some embodiments, the layer, where the pixel electrode 12 is located, is on a side of a layer, where the active layer 32 of the thin film transistor 3 is located, away from the first substrate 11; the layer, where the common electrode 13 is located, is on a side of a layer, where the source/drain electrode 31 of the thin film transistor 3 is located, away from the first substrate 11. The pixel electrode 12 and the common electrode 13 are disposed oppositely to each other in a thickness direction of the first substrate 11, and the pixel electrode 12 and the common electrode 13 cooperate to form a control electric field, to control the rotation of the liquid crystals. The control electric field is related to an area of portions of the pixel electrode 12 and the common electrode 13 directly facing to each other and a distance between the pixel electrode 12 and the common electrode 13. If the area is too small, or the distance is too large, the resulting control field may not be sufficient to effectively control the rotation of the liquid crystals. At this time, in the embodiment of the present disclosure, the position of the pixel electrode 12 is adjusted such that the pixel electrode 12 is disposed closer to the common electrode 13, thereby increasing the strength of the control electric field. In some embodiments, the pixel electrode 12 may be located on a side of the layer, where the active layer 32 of the thin film transistor 3 is located, away from the first substrate 11. Specifically, the layer, where the pixel electrode 12 is located, may be located between the active layer of the thin film transistor 3 and the source/drain electrode 31 of the thin film transistor 3. At this time, the pixel electrode 12 and the drain electrode of the thin film transistor 3 may be directly electrically connected to each other without vias, thereby reducing the number of vias in the array substrate and effectively improving the aperture ratio of the pixel.

In some embodiments, the size of the pixel electrode 12 is smaller than 170 µm*170 µm. Specifically, for example, the pixel size of a 55 inch 8k display panel is 157.5 µm*157.5 µm. When the size of the pixel electrode is smaller than or equal to the above-mentioned size, the area of the pixel electrode 12 is small. If a distance between the pixel electrode and the common electrode 13 is greater than a distance between the thin film transistor 3 and the common electrode 13, the control electric field formed by the pixel electrode 12 and the common electrode 13 usually cannot satisfy the effective control of the liquid crystal layer, which limits the progress of the high resolution display panel. In the embodiment of the present disclosure, the above-mentioned scheme may be adopted to adjust the layer, where the pixel electrode 12 is located, upwards to be located between the active layer and the source/drain electrode 31 of the thin film transistor 3, thereby reducing the distance between the pixel electrode 12 and the common electrode 13, enhancing the control electric field without increasing the area of the pixel electrode 12, which facilitates forming a display panel with higher resolution.

According to various embodiments of the present disclosure, there is provided a display panel including at least the dual gate array substrate as described above. For example, the display panel may be various types of display devices such as LCDs including the dual gate array substrate as described above, or display devices will be developed in the future, or the like.

In some embodiments, the display panel further includes a color filter substrate; the color filter substrate and the array substrate are aligned and assembled to form a cell. The color filter substrate includes spacers which are arranged on a second substrate 22, an orthographic projection of the spacers on the first substrate 11 is overlapped with an orthographic projection of some data lines 15 on the first substrate 11, and is not overlapped with an orthographic projection of the gate lines 14 on the first substrate 11.

Figure 7:
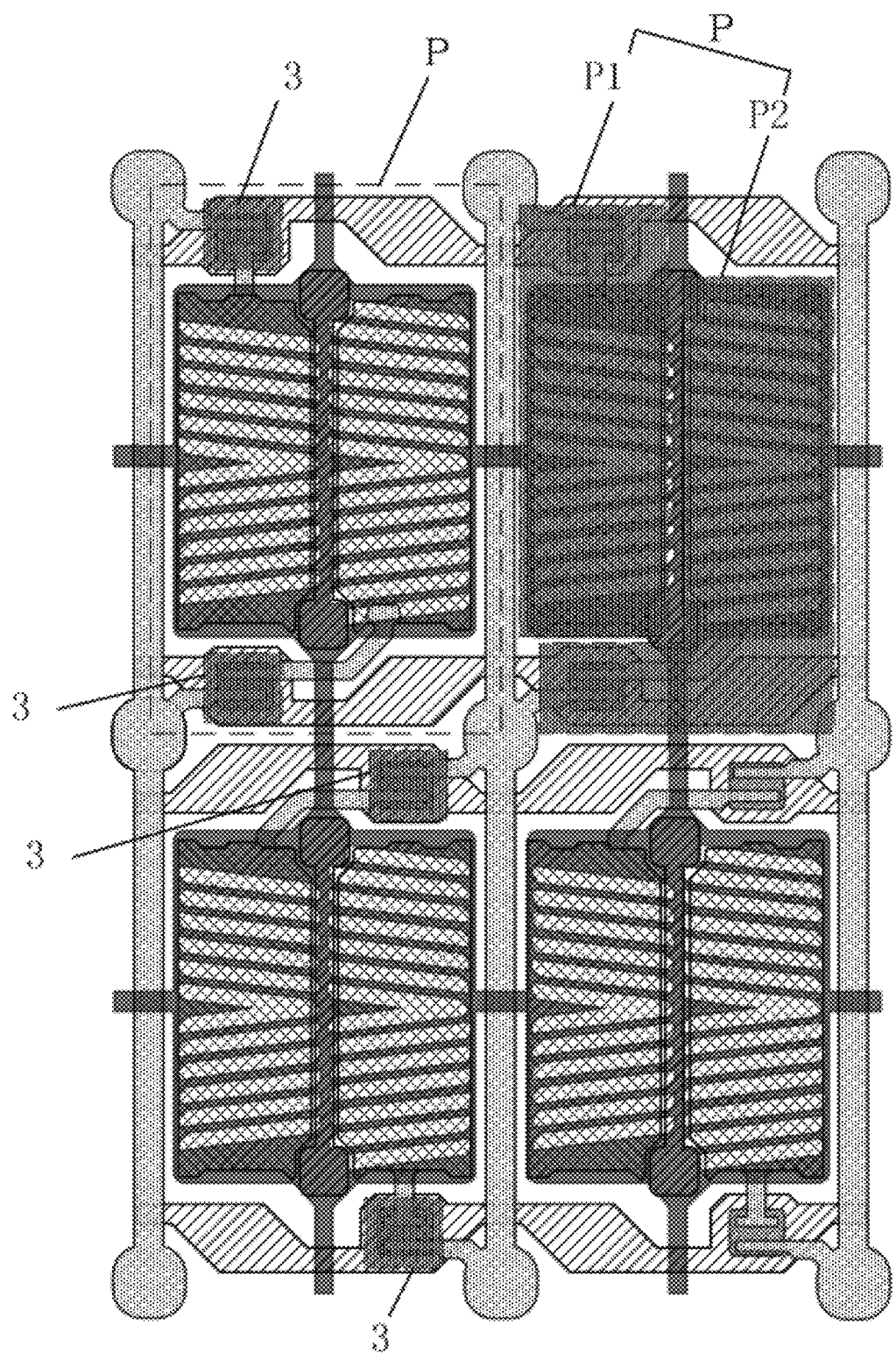
FIG. 7 is a schematic plan view of another dual gate array substrate according to an embodiment of the present disclosure.
Figure 8:
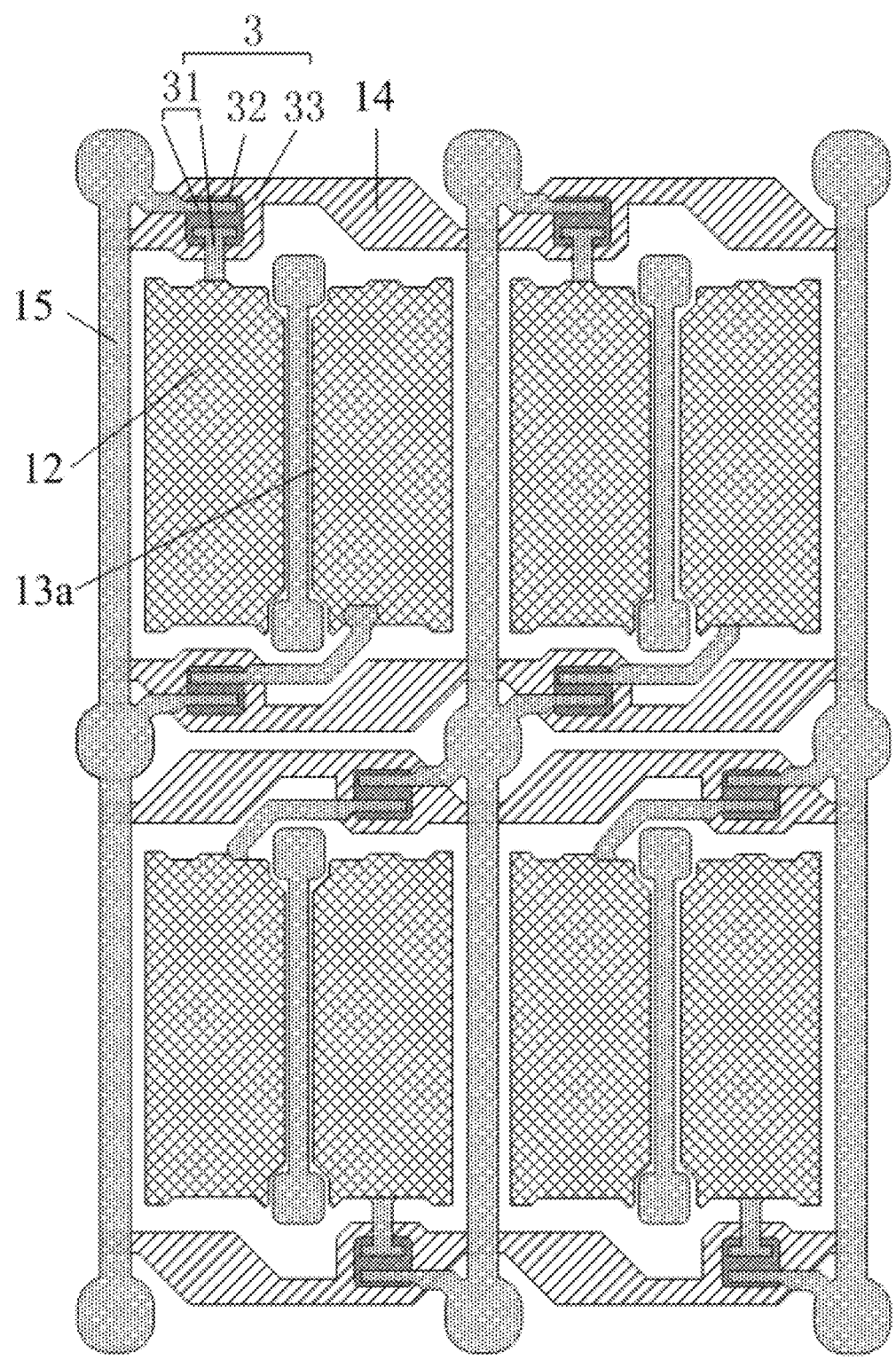
FIG. 8 is a schematic plan view of the dual gate array substrate in FIG. 7 with a common electrode removed.
Figure 9:
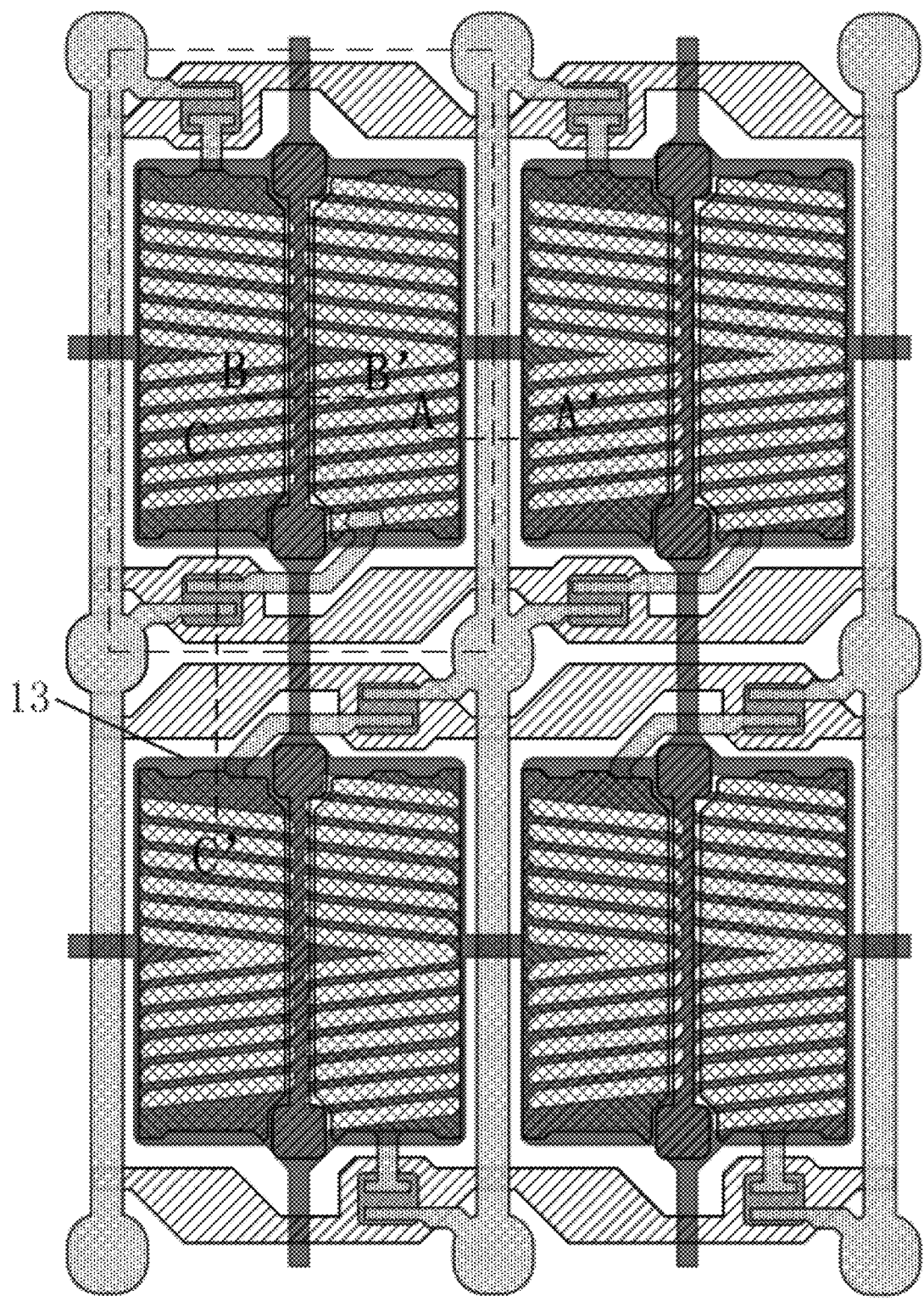
FIG. 9 is a schematic plan view of another dual gate array substrate according to an embodiment of the present disclosure.
Figure 10:
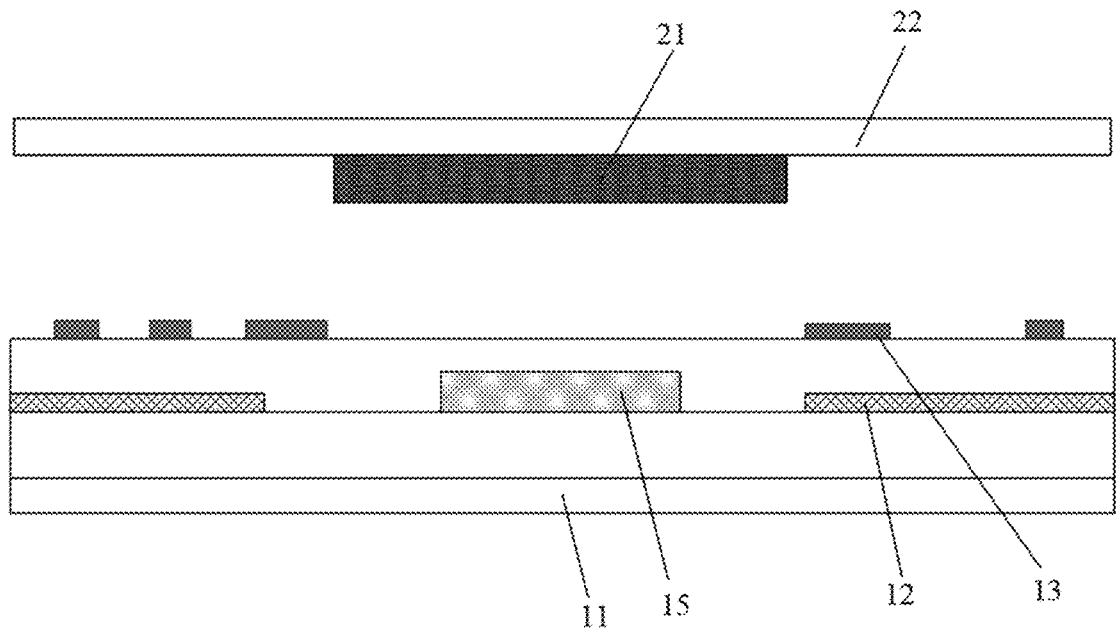
FIG. 10 is a schematic cross-sectional view along a line AA' in the plan view of the dual gate array substrate shown in FIG. 9.
Figure 11:
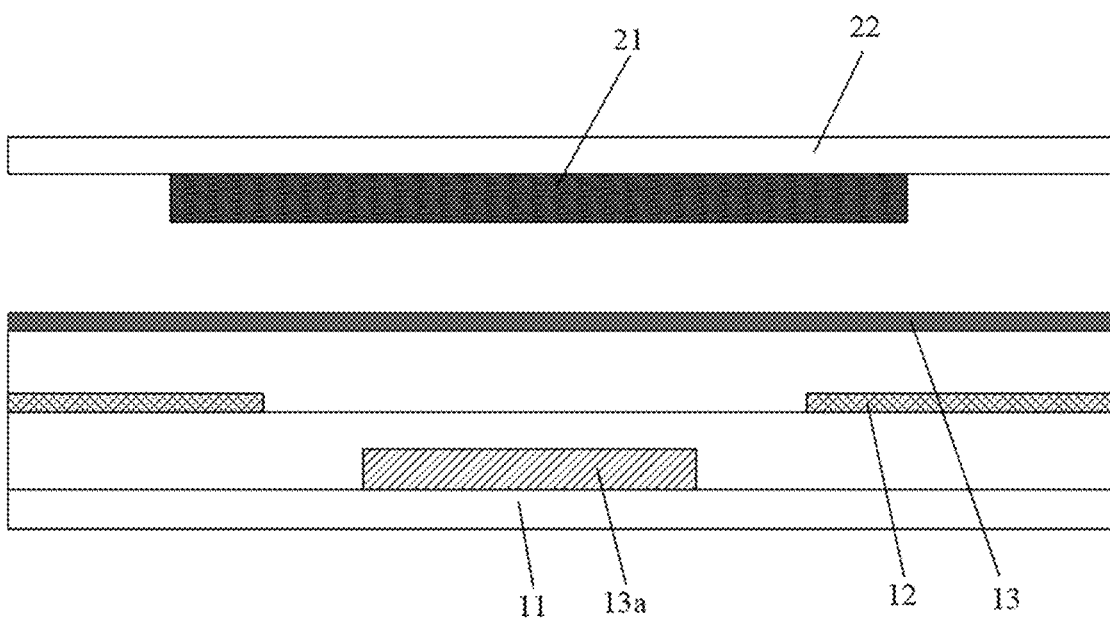
FIG. 11 is a schematic cross-sectional view along a line BB' in the plan view of the dual gate array substrate shown in FIG. 9.
Figure 12:
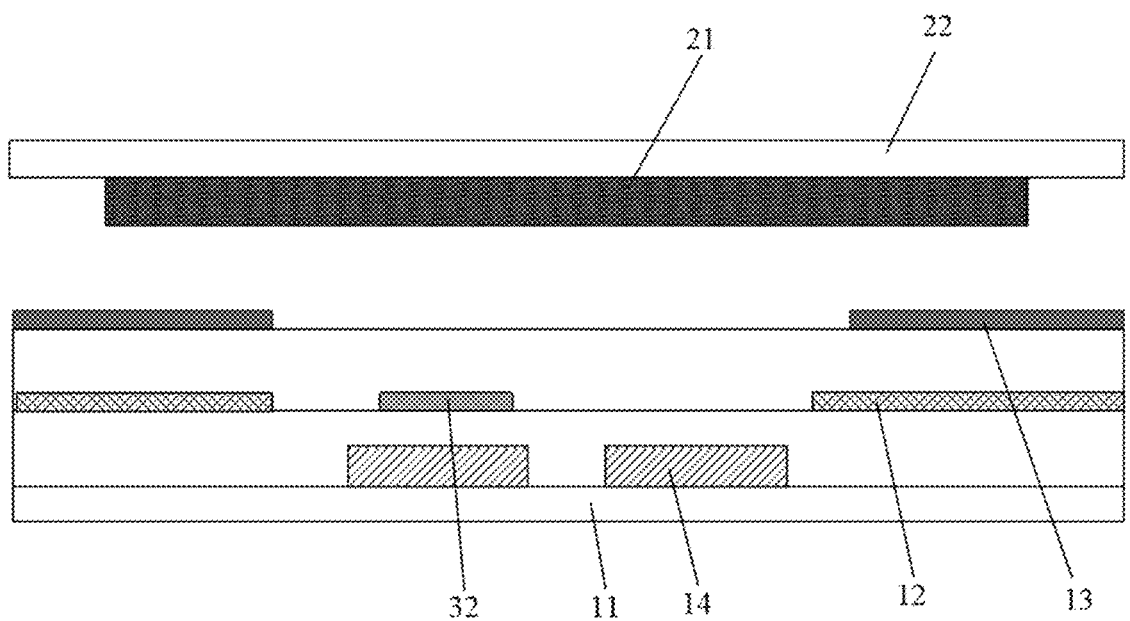
FIG. 12 is a schematic cross-sectional view along a line CC' in the plan view of the dual gate array substrate shown in FIG. 9.

In some embodiments, four pixel pairs P, which are adjacent to each other in the direction of the data line 15 and adjacent to each other in the direction of the gate line 14, form a pixel group; a center of a region where the spacer is located overlaps with a center of a region where one pixel group is located. Referring to FIGS. 1 and 7, respective two pixel pairs P located at both sides of a same data line 15 form a pixel group. Upon the color filter substrate and the array substrate are aligned and assembled into a cell, the spacer is located at the center of the corresponding pixel group to support the cell gap of the display panel. The spacers correspond to a partial region of the data line 15, and do not correspond to the gate metal layer. All around the region where the spacer is located, are arranged metal materials of the data line 15 and the gate electrode, that is, a bimetal layer, which can restrict a sliding space of the spacer to a certain extent.

In some embodiments, the color filter substrate further includes a layer of a black matrix 21 which is arranged on a side of the layer, where the spacer is located, close to the second substrate 22; an orthographic projection of the layer of the black matrix 21 on the first substrate 11 covers the orthographic projection of the spacer on the first substrate 11. Referring to FIG. 2, the layer of the black matrix 21 is located on a side of the spacer away from the second substrate 22, and the layer of the black matrix 21 needs to shield the spacer, so that the orthographic projection of the layer of the black matrix 21 on the first substrate 11 should cover the orthographic projection of the spacer on the first substrate 11. Meanwhile, considering the possible offset of the spacer during the use of the display panel, the orthographic projection of the black matrix 21 on the first substrate 11 is necessarily larger than the orthographic projection of the spacer on the first substrate 11, so as to ensure that the black matrix 21 may still shield the shifted spacer. In the embodiment of the present disclosure, in a case where the spacer is located at the center of the pixel group, the offset of the spacer is smaller due to the limiting effect of the bimetal layer on the spacer, so that the arrangement area of the black matrix 21 can be reduced, thereby contributing to the improvement of the aperture ratio.

It should be noted that, in the present disclosure, relational terms such as first and second, and the like are only used to distinguish one entity or operation from another entity or operation, and do not necessarily require or imply any such actual relationship or order between such entities or operations. Moreover, the terms "comprises (includes)", "comprising (including)", or any other variation thereof, are intended to encompass a non-exclusive inclusion, such that a process, method, article, or apparatus that includes a list of elements include those elements and may include other elements not expressly listed or inherent to such process, method, article, or apparatus. Without further limitation, an element "comprising (including) a/an . . . " does not exclude the presence of additional identical elements in the process, method, article, or apparatus that includes the element.

Embodiments in accordance with the present disclosure are described above, but these embodiments do not exhaust all the details and do not limit the invention to only the specific embodiments. Obviously, many modifications and variations are possible in light of the above description. These embodiments were chosen and described in this specification, in order to better explain the principles and the practical application of the invention, so that one of ordinary skill in the art can better utilize the present disclosure and modifications based on the present disclosure. The invention is limited only by the claims and their full scope and equivalents.

What is claimed is:

1. A dual gate array substrate, comprising a plurality of groups of dual gate lines, a plurality of data lines and a plurality of pixel pairs arranged on a first substrate;

each group of the plurality of groups of dual gate lines comprising two gate lines opposite to each other; the plurality of groups of dual gate lines intersecting with the plurality of data lines;

each group of dual gate lines and the plurality of data lines defining a plurality of defined regions; each pixel pair being in a corresponding defined region; the pixel pair comprising two pixel units arranged along an extending direction of the gate line; the pixel unit comprising a common electrode and a thin film transistor, wherein the dual gate array substrate further comprises a plurality of common electrode lines, each of the plurality of common electrode lines is arranged between two pixel units in a same pixel pair; and a layer where the common electrode line is located and a layer where a source/drain electrode of the thin film transistor is located are different layers and insulated from each other, wherein the two pixel units in the same pixel pair are connected to a same data line;

in two pixel pairs adjacent to each other in an extending direction of the data line, the pixel units in different pixel pairs are connected to two adjacent data lines, respectively; and in two pixel pairs adjacent to each other in the extending direction of the gate line, the pixel units in different pixel pairs are connected to two adjacent data lines, respectively.

2. The dual gate array substrate according to claim 1, wherein the common electrode line and a gate electrode of the thin film transistor are in a same layer and insulated from each other.

3. The dual gate array substrate according to claim 2, wherein the common electrodes of both pixel units in the same pixel pair have a one-piece structure.

4. The dual gate array substrate according to claim 1, wherein the pixel unit further comprises a pixel electrode; an insulating layer is arranged between a layer where the pixel electrode is located and the layer where the source/drain electrode of the thin film transistor is located; the insulating layer comprises a first via, through which the pixel electrode is connected to a drain electrode of a corresponding thin film transistor; and in the same pixel pair, a region of the first via in the extending direction of the gate line falls into a region of a corresponding pixel unit in the extending direction of the gate line.

5. The dual gate array substrate according to claim 4, wherein an orthographic projection of the common electrode on the first substrate covers an orthographic projection of the pixel electrode on the first substrate.

6. The dual gate array substrate according to claim 4, wherein a layer, where the pixel electrode is located, is on a side of a layer, where the thin film transistor is located, close to the first substrate; and a layer, where the common electrode is located, is on a side of the layer, where the thin film transistor is located, away from the first substrate.

7. The dual gate array substrate according to claim 6, wherein a size of the pixel electrode is greater than or equal to 170 μm*170 μm.

8. The dual gate array substrate according to claim 4, wherein a layer, where the pixel electrode is located, is on a side of a layer, where an active layer of the thin film transistor is located, away from the first substrate; and
a layer, where the common electrode is located, is on a side of the layer, where the source/drain electrode of the thin film transistor is located, away from the first substrate.

9. The dual gate array substrate according to claim 8, wherein a size of the pixel electrode is smaller than 170 μm*170 μm.

10. A display panel comprising the dual gate array substrate according to claim 1.

11. The display panel according to claim 10, wherein the display panel further comprises a color filter substrate; the color filter substrate and the array substrate are aligned and assembled to form a cell; the color filter substrate comprises spacers which are arranged on a second substrate, and an orthographic projection of the spacers on the first substrate is overlapped with an orthographic projection of certain data lines of the plurality of data lines on the first substrate, and is not overlapped with an orthographic projection of the gate lines on the first substrate.

12. The display panel according to claim 11, wherein four of the plurality of pixel pairs, which are adjacent to each other in a direction of the data line and adjacent to each other in a direction of the gate line, form one pixel group; a center of a region where the spacer is located overlaps with a center of a region where the one pixel group is located.

13. The display panel according to claim 11, wherein the color filter substrate further comprises a black matrix layer which is arranged on a side of a layer, where the spacers are located, close to the second substrate; and
an orthographic projection of the black matrix layer on the first substrate covers an orthographic projection of the spacers on the first substrate.

14. The display panel according to claim 10, wherein the common electrode line and a gate electrode of the thin film transistor are in a same layer and insulated from each other.

15. The display panel according to claim 14, wherein the common electrodes of both pixel units in the same pixel pair have a one-piece structure.

16. The display panel according to claim 10, wherein the pixel unit further comprises a pixel electrode; an insulating layer is arranged between a layer where the pixel electrode is located and the layer where the source/drain electrode of the thin film transistor is located; the insulating layer comprises a first via, through which the pixel electrode is connected to a drain electrode of a corresponding thin film transistor; and
in the same pixel pair, a region of the first via in the extending direction of the gate line falls into a region of a corresponding pixel unit in the extending direction of the gate line.

17. The display panel according to claim 16, wherein an orthographic projection of the common electrode on the first substrate covers an orthographic projection of the pixel electrode on the first substrate.

18. The display panel according claim 16, wherein a layer, where the pixel electrode is located, is on a side of a layer, where the thin film transistor is located, close to the first substrate; and
a layer, where the common electrode is located, is on a side of the layer, where the thin film transistor is located, away from the first substrate.

* * * * *